United States Patent
Glenn et al.

(10) Patent No.: US 6,521,987 B1
(45) Date of Patent: Feb. 18, 2003

(54) PLASTIC INTEGRATED CIRCUIT DEVICE PACKAGE AND METHOD FOR MAKING THE PACKAGE

(75) Inventors: Thomas P. Glenn, Gilbert, AZ (US); Scott J. Jewler, Gilbert, AZ (US); David Roman, Tempe, AZ (US); Jae Hak Yee, Seoul (KR); Doo Hwan Moon, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/703,195

(22) Filed: Oct. 31, 2000

Related U.S. Application Data

(62) Division of application No. 09/176,614, filed on Oct. 21, 1998, now Pat. No. 6,281,568.

(51) Int. Cl.[7] ............................................. H01L 23/12
(52) U.S. Cl. .................. 257/684; 257/666; 257/696; 257/698; 257/796; 257/674; 257/675; 257/713; 257/707; 257/730; 257/788
(58) Field of Search .................. 257/666, 730, 257/672, 787, 674, 784, 690, 698, 692, 783, 693, 684, 696, 675, 713, 707, 788

(56) References Cited

U.S. PATENT DOCUMENTS

| | | | |
|---|---|---|---|
| 3,838,984 A | 10/1974 | Crane et al. ............... | 29/193.5 |
| 4,054,238 A | 10/1977 | Lloyd et al. | |
| 4,530,152 A | 7/1985 | Roche et al. .................. | 29/588 |
| 4,707,724 A | 11/1987 | Suzuki et al. .................. | 357/71 |
| 4,756,080 A | 7/1988 | Throp, Jr. et al. ............. | 29/827 |
| 4,812,896 A | 3/1989 | Rothgery et al. .............. | 357/70 |
| 5,041,902 A | 8/1991 | McShane | |
| 5,157,480 A | 10/1992 | McShane et al. .............. | 357/74 |
| 5,172,213 A | 12/1992 | Zimmerman ................ | 257/796 |
| 5,172,214 A | 12/1992 | Casto .......................... | 257/676 |

(List continued on next page.)

FOREIGN PATENT DOCUMENTS

| | | | |
|---|---|---|---|
| DE | 197 34 794 | 7/1998 | ........... H01L/23/50 |
| EP | 0794572 A2 | 9/1997 | ......... H01L/23/495 |
| JP | 55 163868 | 12/1980 | ........... H01L/23/48 |
| JP | 57-45959 | 3/1982 | ........... H01L/23/28 |
| JP | 59-227143 | 12/1984 | ........... H01L/23/12 |
| JP | 60-52050 | 3/1985 | ........... H01L/23/48 |
| JP | 60 195957 | 10/1985 | ........... H01L/23/48 |
| JP | 61-39555 | 2/1986 | ........... H01L/23/36 |
| JP | 62-9639 | 1/1987 | ........... H01L/21/56 |
| JP | 63-205935 | 8/1988 | ........... H01L/23/28 |
| JP | 63-233555 | 9/1988 | ........... H01L/23/30 |
| JP | 6-54749 | 3/1989 | ........... H01L/23/28 |
| JP | 1-106456 | 4/1989 | ........... H01L/23/50 |
| JP | 6-92076 | 4/1995 | ........... B42D/15/10 |
| JP | 7-312405 | 11/1995 | ........... H01L/23/50 |
| JP | 8-125066 | 5/1996 | ........... H01L/23/12 |
| JP | 8-306853 | 11/1996 | ........... H01L/23/50 |
| JP | 9-8205 | 1/1997 | ........... H01L/23/50 |
| JP | 9-8206 | 1/1997 | ........... H01L/23/50 |
| JP | 9-8207 | 1/1997 | ........... H01L/23/50 |
| JP | 9-92775 | 4/1997 | ........... H01L/23/50 |
| KR | 94-1979 | 1/1994 | ........... H01L/21/56 |
| KR | 97-72358 | 11/1997 | ........... H01L/23/50 |

*Primary Examiner*—Albert W. Paladini
*Assistant Examiner*—Luan Thai
(74) *Attorney, Agent, or Firm*—Stetina Brunda Garred & Brucker

(57) ABSTRACT

A package for an integrated circuit device, having a die, a die pad, leads, bond wire, and an encapsulant. The lower surfaces of the die pad and the leads are provided with stepped profiles. Structures extending from lateral sides of the leads are formed to prevent the leads from being pulled horizontally from the package. Encapsulant material fills beneath the recessed, substantially horizontal surfaces of the die pad and the leads, and thereby prevents the die pad and the leads from being pulled vertically from the package body. Other portions of the die pad and the leads are exposed within the package for connecting the package externally.

18 Claims, 13 Drawing Sheets

U.S. PATENT DOCUMENTS

| | | | |
|---|---|---|---|
| 5,200,362 A | 4/1993 | Lin et al. | 437/207 |
| 5,200,809 A | 4/1993 | Kwon | 257/707 |
| 5,214,845 A | 6/1993 | King et al. | 29/841 |
| 5,216,278 A | 6/1993 | Lin et al. | 257/688 |
| 5,221,642 A | 6/1993 | Burns | 437/207 |
| 5,258,094 A | 11/1993 | Furui et al. | 156/634 |
| 5,273,938 A | 12/1993 | Lin et al. | |
| 5,277,972 A | 1/1994 | Sakumoto et al. | 428/355 |
| 5,278,446 A | 1/1994 | Nagaraj et al. | 257/707 |
| 5,279,029 A | 1/1994 | Burns | 29/856 |
| 5,332,864 A | 7/1994 | Liang et al. | 174/52.4 |
| 5,336,931 A | 8/1994 | Juskey et al. | 257/787 |
| 5,343,076 A | 8/1994 | Katayama et al. | 257/717 |
| 5,406,124 A | 4/1995 | Morita et al. | 257/783 |
| 5,424,576 A | 6/1995 | Djennas et al. | 257/666 |
| 5,435,057 A | 7/1995 | Bindra et al. | 29/830 |
| 5,474,958 A | 12/1995 | Djennas et al. | 437/211 |
| 5,521,429 A | 5/1996 | Aono et al. | 257/676 |
| 5,604,376 A | 2/1997 | Hamburgen et al. | 257/676 |
| 5,608,267 A | 3/1997 | Makulikar et al. | 256/796 |
| 5,639,990 A | 6/1997 | Nishihara et al. | 174/52.2 |
| 5,640,047 A | 6/1997 | Nakashima | 257/738 |
| 5,641,997 A | 6/1997 | Ohta et al. | 257/788 |
| 5,646,831 A | 7/1997 | Manteghi | 361/813 |
| 5,650,663 A | 7/1997 | Parthasarathi | 257/706 |
| 5,683,806 A | 11/1997 | Sakumoto et al. | 428/343 |
| 5,696,666 A | 12/1997 | Miles et al. | 361/764 |
| 5,701,034 A | 12/1997 | Marrs | 256/706 |
| 5,710,064 A | 1/1998 | Song et al. | 437/220 |
| 5,736,432 A | 4/1998 | Mackessy | 438/123 |
| 5,776,798 A | 7/1998 | Quan et al. | 438/112 |
| 5,783,861 A | 7/1998 | Son | 253/693 |
| 5,835,988 A | 11/1998 | Ishii | 257/684 |
| 5,859,471 A | 1/1999 | Kuraishi et al. | 256/666 |
| 5,866,939 A | 2/1999 | Shin et al. | 257/666 |
| 5,877,043 A | 3/1999 | Alcoe et al. | 438/123 |
| 5,894,108 A | 4/1999 | Mostafazadeh et al. | 174/52.4 |
| 5,942,794 A * | 8/1999 | Okumura et al. | 257/666 |
| 5,977,613 A | 11/1999 | Takata et al. | 257/666 |
| 5,977,615 A * | 11/1999 | Yamaguchi et al. | 257/666 |
| 5,977,630 A | 11/1999 | Woodworth et al. | 257/712 |
| 5,981,314 A | 11/1999 | Glenn et al. | 438/127 |
| 5,986,885 A | 11/1999 | Wyland | |
| 6,001,671 A | 12/1999 | Fjelstad | 438/112 |
| 6,025,640 A | 2/2000 | Yagi et al. | 257/666 |
| 6,072,228 A | 6/2000 | Hinkle et al. | |
| 6,130,115 A | 10/2000 | Okumura et al. | 438/124 |
| 6,130,473 A | 10/2000 | Mostafazadeh et al. | |
| 6,140,154 A | 10/2000 | Hinkle et al. | |
| 6,143,981 A | 11/2000 | Glenn | 174/52.4 |
| 6,198,171 B1 | 3/2001 | Huang et al. | 257/787 |
| 6,225,146 B1 | 5/2001 | Yamaguchi et al. | 438/123 |
| 6,229,200 B1 * | 5/2001 | Mclellan et al. | 257/666 |
| 6,242,281 B1 | 6/2001 | Mclellan et al. | 438/106 |
| 6,281,568 B1 | 8/2001 | Glenn et al. | 257/684 |

* cited by examiner

```
┌─────────────────────────────────────────────────┐
│ Provide a metal sheet including of plurality of │
│ interconnected frames in a matrix, with each    │
│ frame having a die pad within and connected to  │
│ the frame, and leads extending toward the die   │
│ pad without contacting the die pad, wherein the │
│ lower surfaces of the die pad and leads have    │
│ vertically recessed approximately horizontal    │
│ surfaces                                        │
└─────────────────────────────────────────────────┘ — 1
                         │
                         ▼
┌─────────────────────────────────────────────────┐
│ Place an integrated circuit die onto a first    │
│ surface of each die pad                         │
└─────────────────────────────────────────────────┘ — 2
                         │
                         ▼
┌─────────────────────────────────────────────────┐
│ Electrically connect bonding pads on each die   │
│ to a first surface of the leads                 │
└─────────────────────────────────────────────────┘ — 3
                         │
                         ▼
┌─────────────────────────────────────────────────┐
│ Apply an encapsulant material onto the metal    │
│ sheet, covering each die, and the first         │
│ surfaces of the die pad and leads, the sides of │
│ the die pad and leads, and the vertically       │
│ recessed lower surfaces of the die pad and      │
│ leads associated with each die                  │
└─────────────────────────────────────────────────┘ — 4
                         │
                         ▼
┌─────────────────────────────────────────────────┐
│ Plate exposed surfaces of the sheet with metal  │
└─────────────────────────────────────────────────┘ — 5
                         │
                         ▼
┌─────────────────────────────────────────────────┐
│ Cut the encapsulated sheet severing the die     │
│ pads and leads from their respective frames and │
│ severing a plurality of completed packages from │
│ the sheet                                       │
└─────────────────────────────────────────────────┘ — 6
```

*FIG. 14*

PLASTIC INTEGRATED CIRCUIT DEVICE PACKAGE AND METHOD FOR MAKING THE PACKAGE

This is a divisional application of Application No. 09/176,614, filed Oct. 21, 1998, now U.S. Pat. No. 6,281, 568.

FIELD OF THE INVENTION

The present invention is to directed toward an improved plastic package for an integrated circuit die, and a method and leadframe for making such a package.

BACKGROUND OF THE INVENTION

Integrated circuit die are conventionally enclosed in plastic packages that provide protection from hostile environments and enable electrical interconnection between the integrated circuit die and printed circuit boards. The elements of such a package include a metal leadframe, an integrated circuit die, bonding material to attach the integrated circuit die to the leadframe, bond wires which electrically connect pads on the integrated circuit die to individual leads of the leadframe, and a hard plastic encapsulant material which covers the other components and forms the exterior of the package.

The leadframe is the central supporting structure of such a package. A portion of the leadframe is internal to the package, i.e., completely surrounded by the plastic encapsulant. Portions of the leads of the leadframe extend eternally from the package and are used to connect the package externally.

Further background information concerning conventional plastic integrated circuit packages and leadframes is contained in chapter 8 of the book Microelectronics Packaging Handbook (1989), which was edited by R. Tummala and E. Rymaszewski, and is published by Van Nostrand Reinhold, 114 Fifth Avenue, New York, N.Y.

A problem with conventional plastic packages is that their internal leadframes limit reduction of the size of the packages. Practitioners have attempted to reduce the size of packages by eliminating internal leadframes, as is shown in U.S. Pat. No. 4,530,142 to Roche et al and U.S. Pat. No. 5,172,213 to Casto, but these packages have numerous disadvantages. The contacts of the package shown by Roche et al. in the '142 patent have orthogonal side surfaces. Accordingly, the packages are believed to be unreliable because the contacts could easily be pulled from the encapsulant material. The package shown by Casto in the '213 patent has bent leads which extend vertically above the die pad to the top of the die. Including such leads in a package would increase manufacturing costs and limit reductions in the lateral size of the package. Accordingly, there is a need for a smaller and more reliable plastic package.

SUMMARY OF THE INVENTION

The present invention is directed toward improved plastic packages for housing an integrated circuit die, and to leadframes and methods for making such packages. In one embodiment of an assembly method for a package within the present invention, Step 1 provides a metal leadframe. The leadframe includes a disposable rectangular frame. A die pad is within and connected to the frame. A plurality of leads extend laterally from the frame toward the die pad without contacting the die pad.

The die pad of the leadframe has a rectangular perimeter. The die pad has a horizontal first surface upon which a die is placed during package assembly. Opposite the first surface is a substantially planar central second surface and a peripheral substantially planar third surface. The third surface is at the periphery of the second surface, and is vertically recessed from the second surface, so that the lower surface of die pad has a stepped profile. In a completed package, encapsulant material fills in beneath the recessed third surface of the die pad, but does not cover the second surface of the die pad. The encapsulant material beneath the third surface of the die pad prevents the die pad from being pulled vertically from the package.

Each lead has a first surface, a second surface that is opposite the first surface, and a third surface that also is opposite the first surface and adjacent to the second surface. The second surface has a rectangular or circular perimeter. The third surface is vertically recessed from the second surface, which results in the lower surface of the lead having a stepped profile. In a completed package, encapsulant material fills in beneath the third surface of the lead, but does not cover the second surface of the lead. The second surface of the lead serves as a contact for connecting the package externally, as in an LCC package, or serves as a land for the connection of a solder ball. The encapsulant material beneath the third surface of the lead prevents the lead from being pulled vertically from the package.

The leadframe is formed by a two-step wet etching process from a rolled metal strip. The first etching step is a one or two sided etch that etches through the metal strip and thereby transfers the desired overall pattern of the leadframe into the metal strip. The second etching step is a single-sided etch that etches the periphery of the die pad and selected portions of the leads. The second step etches partially through the thickness of the die pad and leads, and thereby forms the above-described, vertically recessed, planar or substantially planar third surfaces in the die pad and the leads.

Step 2 places an integrated circuit on the upper first surface of the die pad. Depending on the application, the area of the die may be less than the area of the first surface of the die pad, or may be greater in area such that the die overhangs the peripheral sides of the die pad. In some cases, the die also overhangs part of the length of the leads.

Step 3 electrically connects a bond wire or an equivalent conductor between each bonding pad of the die and a first surface of each lead. The portion of the lead to which the bond wire is connected may be plated, for example, with silver, gold, or other metals.

Step 4 applies a viscous adhesive encapsulant material onto the die and the upward facing first surface of the leadframe. The encapsulant material is then hardened. The encapsulant material covers the die, the bond wires, the first surfaces of the leads, the third surfaces of the die pad and leads, and the side surfaces of the die pad and leads. The second surfaces of the die pad and leads are not covered by encapsulant material, but rather are exposed at the lower external surface of the package.

Step 5 plates the exposed surfaces of the leadframe, including the exposed second surfaces of the die pad and leads, with a metal, such as copper, gold, lead-tin solder, tin, nickel, palladium, or any solderable metal. Depending on the application and the material used for making the leadframe, Step 5 may be omitted.

Step 6 severs a completed package from the encapsulated leadframe. In particular, step 6 obliterates the disposable portions of the leadframe and/or severs the disposable portions of the leadframe, such as the rectangular frame, from the non-disposable components of the leadframe, such as the die pad and leads. Depending on the method of encapsulation used in step 4, step 6 also may cut the encapsulant material to form peripheral sides of the package.

Step 6 severs the leads from the leadframe. The cut is made inside the dam bar. Depending on where the cut is made, an end portion of the severed lead may extend laterally beyond the sides of the package. Step 6 or a subsequent step also may include bending this protruding end portion of the severed lead up the side of the package so that the end portion of the lead is at an oblique angle to the lower external surface of the package and the encapsulated remainder of the lead. When the package is soldered to a printed circuit board, solder may be connected to the upwardly bent end portion of the severed lead in addition to the horizontal portion of the lead exposed at the lower external surface of the package to strengthen the solder connection. The lower external surface of the package includes: the second surface of the die pad, which is at the center of the bottom surface of the package; the second surfaces of the leads, and hardened encapsulant material, which forms the remainder of the bottom surface of the package and isolates the die pad and leads from each other.

The package of the present invention has numerous advantages, and is useful in numerous applications, including power devices and analog devices. The package may be made small in size. For example, the packages may be near chip size. In addition, the packages may be very thin. Packages having thickness as low as about 0.5 mm or less can be fabricated according the present invention. In addition, the leads can be placed close to the die, minimizing the length of bond wires. The exposed second surface of the die pad can be connected by metal solder to the printed circuit board for package cooling.

Numerous variations of the leadframe, package, and assembly method described above also are described in this application, and also form part of the present invention. For example, in one alternative assembly method, a leadframe is provided which allows a plurality of packages to be constructed simultaneously.

BRIEF DESCRIPTION OF DRAWINGS

FIG. 14 is a flow chart of a method of making a plurality of packages simultaneously.

DETAILED DESCRIPTION

Figure 1:
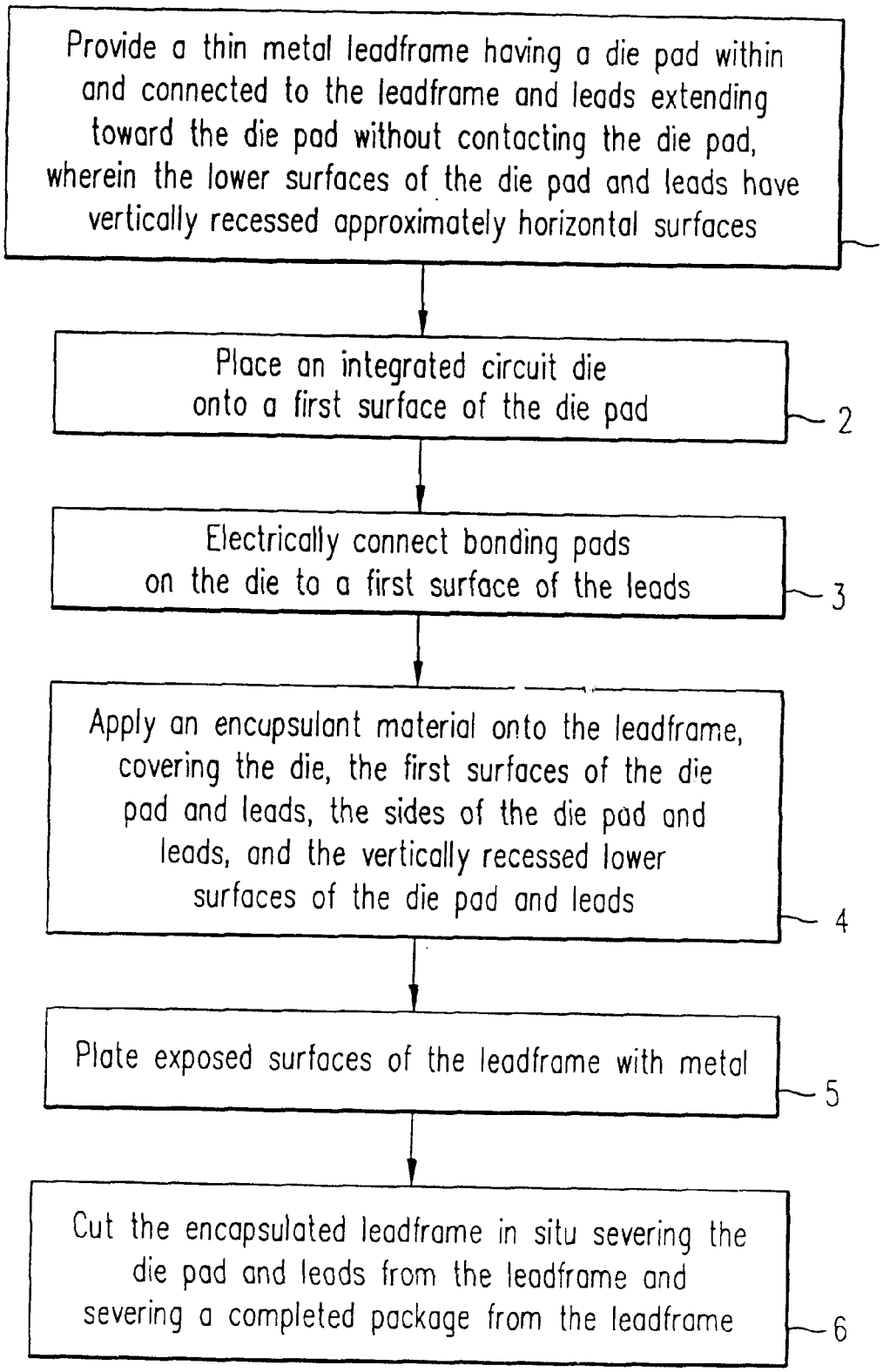
FIG. 1 is a flow chart of a method of making a package.
Figure 5:
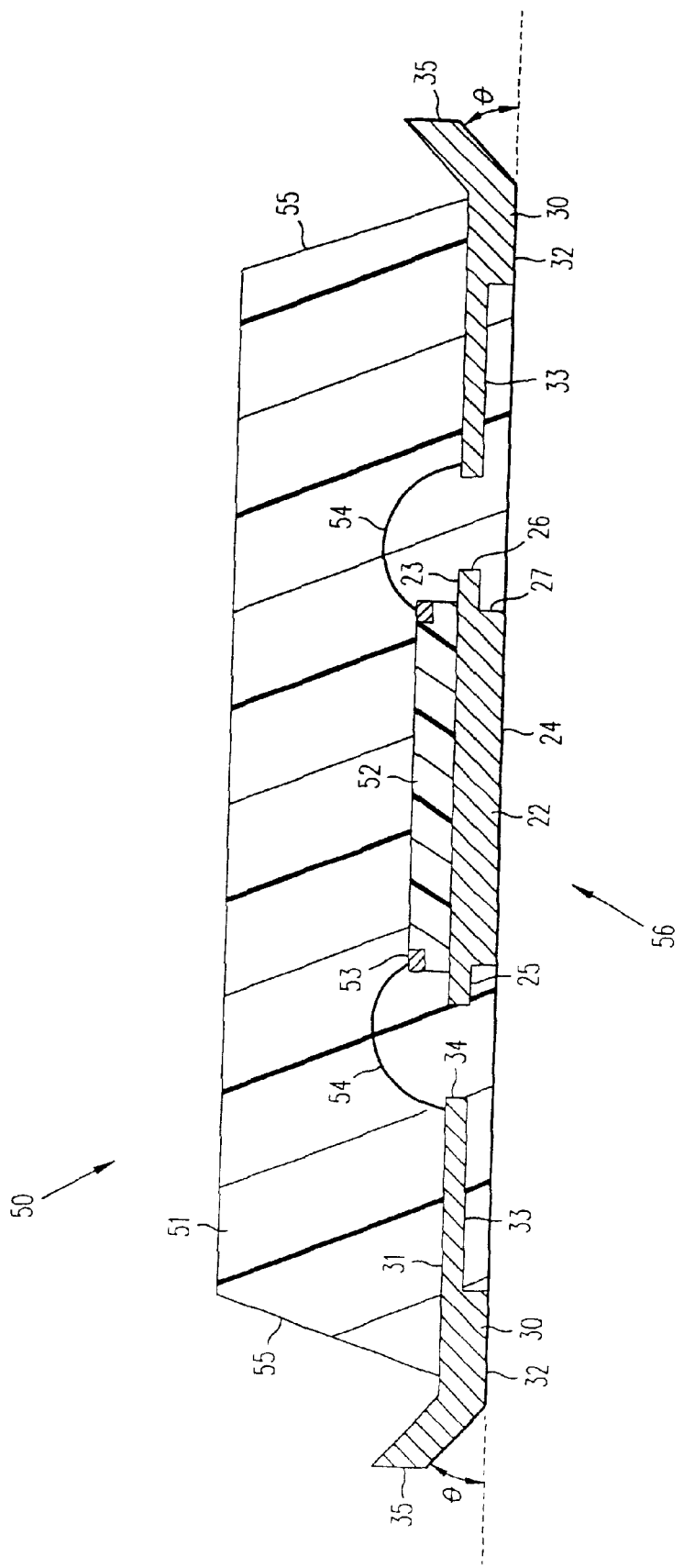
FIG. 5 is a cross-sectional side view of a completed package where the package body was molded and a punch was used to separate the package from the leadframe.

FIG. 1 is a flow chart of a method in accordance with the present invention for assembling an integrated circuit device package. FIG. 5 shows an embodiment of a package, in accordance with the present invention, which may be formed by the method of FIG. 1.

Figure 2:
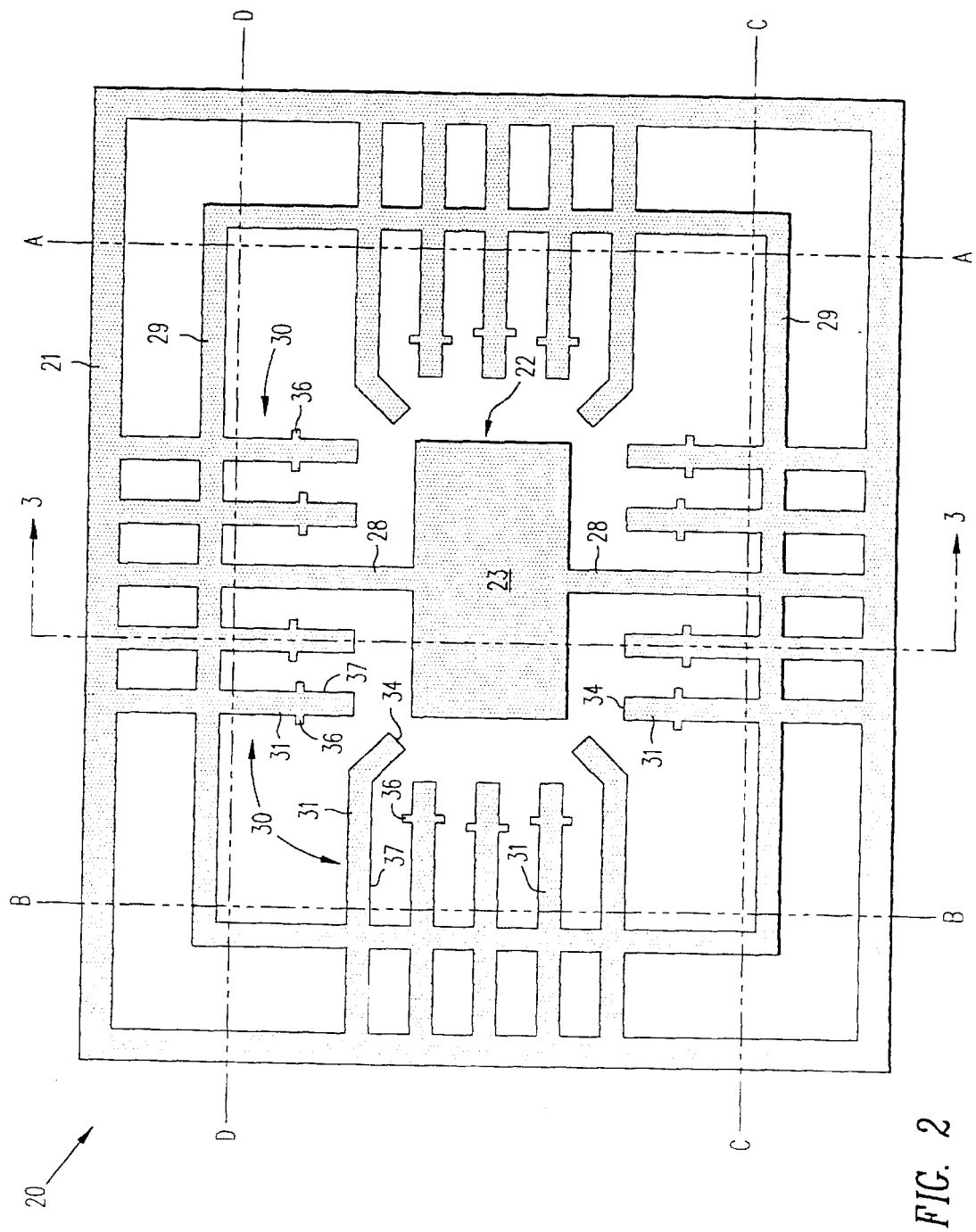
FIG. 2 is a plan view a leadframe used for making a package.

Step 1 of FIG. 1 provides a metal leadframe. FIG. 2 is a plan view of a leadframe 20 in accordance with the present invention. For ease of view, shading is used in FIG. 2 (and the other figures) to distinguish the metal portions of leadframe 20 from empty space between the metal portions of leadframe 20.

Leadframe 20 of FIG. 2 is made of a conventional leadframe metal, such as copper or copper alloys, plated copper, plated copper alloys, Alloy 37 (37% nickel, 55% iron), or copper plated steel, depending on the application.

Leadframe 20 of FIG. 2 includes a peripheral rectangular tie bar 21 and a central rectangular dam bar 29. (Artisans will understand that the terms "rectangular" or "rectangle" include a square, which is a rectangle with four equivalent sides.) In an alternative embodiment (not shown), such as where a plurality of leadframes 20 are etched into a metal strip (e.g., FIG. 16), tie bar 21 may be omitted, and the leadframe perimeter may be formed by a portion of the metal strip between adjacent leadframes. In another alternative embodiment (not shown), tie bar 21 and the portions of the leads between tie bar 21 and dam bar 29 may be omitted, so that the outer frame of the leadframe is dam bar 29.

A die pad 22 having a rectangular perimeter is connected to leadframe 21. Die pad 22 is inside dam bar 29. Two connectors 28 connect die pad 22 to dam bar 29 and tie bar 21 of leadframe 20. In Step 6 of FIG. 1, connectors 28 are severed from leadframe 20 inside of dam bar 29.

Eighteen leads 30 are connected to and extend laterally from tie bar 21 through dam bar 29 toward a side of die pad 22 without contacting die pad 22. First end portion 34 of each lead 30 is adjacent to die pad 22. In Step 6 of FIG. 1, each lead 30 is severed between dam bar 29 and first end 34 of lead 30. In an alternative embodiment (not shown), leads 30 may begin at dam bar 29, instead of at tie bar 21, and dam bar 29 and tie bar 21 may be connected by a plurality of symmetrically placed strips.

The number, location and lateral paths shown in FIG. 2 for leads 30 of leadframe 20 are exemplary only. The number, location, and lateral paths of the leads will vary according to the application. An advantage of the present invention is that the leads can be designed to accommodate the number and location of the bonding pads of a particular integrated circuit die.

Fourteen of the eighteen leads 30 of FIG. 2 are straight. Four leads 30 include a lateral bend between dam bar 29 and die pad 22. Each of the straight leads 30 include anchor ears 36, which project perpendicularly from the lateral side of lead 30. Anchor ears 36 are approximately rectangular and are staggered on adjacent leads 30. In a completed package, anchor ears 36 engage the encapsulant material of the package and prevent leads 30 from being pulled horizontally from the package body. Alternatively, throughholes or depressions in leads 30 may be used instead of anchor ears to engage the encapsulant material.

Figure 3:
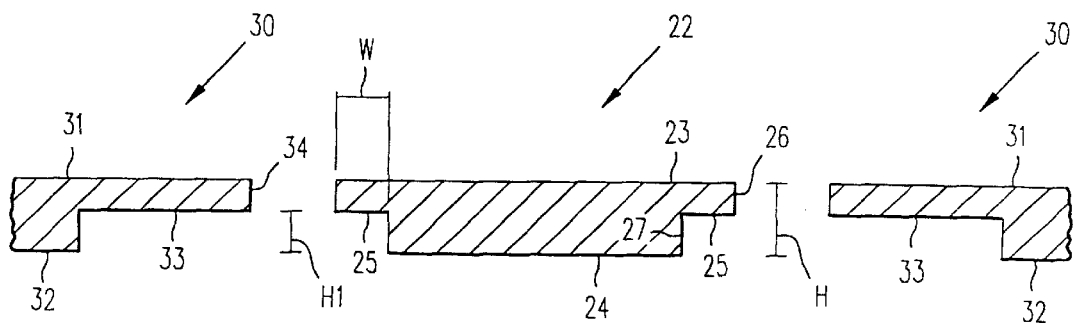
FIG. 3 is a cross-sectional side view of the die pad and leads of FIG. 2 taken inside the dam bar along line 3—3 of FIG. 2.

FIG. 3 is a cross-sectional side view of leadframe 20 inside parallel members of dam bar 29 along line 3—3 of FIG. 2. Die pad 22 and two opposing leads 30 are shown in side view. The portions of leads 30 shown begin immediately inside of dam bar 29. The lower surfaces of both die pad 22 and leads 30 include vertically recessed, horizontal or substantially horizontal surfaces.

Die pad 22 of FIG. 3 has substantially planar or planar upper first surface 23, an opposite substantially planar or planar second surface 24, and an opposite substantially planar or planar third surface 25. Orthogonal first side surface 26 is between first surface 23 and third surface 25, and orthogonal second side surface 27 is between third surface 25 and second surface 24. Third surface 25 is vertically recessed a distance "H1" from second surface 24. In other words, third surface 25 is vertically between first surface 23 and second surface 24. The central portion of die pad 22 has a height "H" between first surface 23 and second surface 24. Third surface 24 of die pad 22 is at the perimeter of second surface 24, and in one embodiment, surrounds second surface 24.

Each lead 30 of FIG. 3 includes a planar or substantially planar first surface 31. Opposite first surface 31 is a planar or substantially planar second surface 32 and a planar or substantially planar third surface 33. Second surface 32 begins at dam bar 29 and extends a short distance inside dam bar 29 towards die pad 22. In this embodiment, second surface 32 has a rectangular perimeter. The length of second surface 32 varies with the application, but should be sufficiently sized for external connection of the package. Third surface 33 extends between second surface 32 and terminal end 34 of lead 30 adjacent to die pad 22. Third surface 33 is vertically recessed a distance "H1" from second surface 32. In other words, third surface 33 is vertically between first surface 3 and second surface 32. Anchor ears 36 (not shown) extend perpendicularly from lateral sides 37 of leads 30 adjacent to third surface 33.

In Step 6 of FIG. 1, after leadframe 20 is encapsulated, leads 30 are severed inside of dam bar 29 along rectilinear lines A—A, B—B, C—C, and D—D of FIG. 2. The cut is made vertically through the portion of lead 30 which includes second surface 32. In a completed package, second surface 32 of each severed lead 30 serves as a package contact to electrically connect the package, directly or indirectly, to a external printed circuit board. In a completed package, third surface 33 of lead 30 is covered with encapsulant material, and hence is internal to the package body (FIG. 5).

Example values for height "H" of die pad 22 and lead 30 of leadframe 20 of FIG. 3 include about 0.15 to 0.50 mm, and values for "H1" include about 0.075 to 0.25 mm. Example values for horizontal indentation "W" of die pad 22 include about 0.025 to 0.25 mm. (These values also apply to the other figures where "H,", "H1," and "W" are shown.) In percentage terms, the value of "H1" may be about 50%, or in the range of 33% to 75%, of the value of "H." i.e., the distance between first surfaces 23 and 31 and second surfaces 24 and 32, respectively. Of course, these values are examples only. Actual values depend on the application.

Leadframe 20 of FIG. 2 is formed from rolled strip metal stock by wet chemical etching. As is well known, chemical etching (also known as chemical milling) is a process that uses photolithography, photoresist, and metal-dissolving liquid chemicals to etch a pattern into a metal strip. Typically, a layer of photoresist is applied to one or both planar surfaces of the strip. Next, the resist layer is exposed to light through a mask having a desired pattern. The photoresist is then developed and cured, forming a patterned photoresist mask, Next, chemicals are sprayed on or otherwise applied to one or both planar surfaces of the masked strip. The exposed portions of the strip are etched away, leaving the desired pattern in the metal strip.

A two step etching process is used to form leadframe 20 of FIGS. 2 and 3 (as well as FIGS. 9, 13, 15 and 16). The first etching step etches from one or both planar surfaces of the strip according to a resist pattern applied onto one or both of the planar surfaces of the strip. This first etching step etches completely through portions of the metal strip to form the overall pattern of the leadframe, as exemplified in FIG. 2. Next, a second resist pattern is formed on portions of one side of the leadframe. The peripheral portions of the die pad and selected portions of the leads are not covered by the second resist pattern, and thus are susceptible to further etching. The second etching step etches partially through leadframe from one side according to the second resist pattern. This second etch step forms-the recessed surfaces of leadframe 20 of FIGS. 2 and 3, e.g., third surface 25 of die pad 22 and third surfaces 33 of leads 30 inside dam bar 29. Inside dam bar 29, connectors 28 typically also are subjected to this second etch step. When the chemicals have etched a selected distance through the thickness of selected portions of the die pad and leads, the second etch step is stopped. In other words, the second etching step etches partially through the thickness of selected portions of the die pad and leads. The amount of the etching by this second etching step is governed by the need to have a sufficient amount of encapsulant material flow beneath third surface 25 of die pad 22 and third surfaces 33 of leads 30 to secure die pad 22 and leads 30 to the package body. Typically, the second etching step removes about 50% of the thickness of the die pad and leads, but the amount removed may range from about 33% to 75% of the thickness of the die pad and leads. Due to imperfections in the etch process, third surfaces 25 and 33 may not be planar, but rather only substantially planar, and the etched sidewalls of die pad 22 and leads 30 may not be at 90° angles, but rather may have radiused corners.

Alternatively, leadframe 20 may be formed by a first step of progressive stamping to form the overall pattern of the leadframe, and a second step of chemically etching partially through the thickness of the die pad and leads of the stamped leadframe, as discussed above, to form the recessed surfaces of leadframe 20.

Step 2 of FIG. 1 places an integrated circuit die 52 onto the center of first surface 23 of die pad 22 (FIG. 5). The placement and attachment of die 52 onto die pad 22 may be performed using a conventional die attach machine and conventional die attach epoxy. During Step 2 and the subsequent assembly steps, leadframe 20 of FIG. 2 is grounded to protect against electrostatic discharge ("ESD").

Step 3 of FIG. 1 electrically connects a conductive metal bond wire 54 or equivalent between individual bonding pads 53 on integrated circuit die 52 (FIG. 5) and first surface 31 of individual leads 30. First surface 31 may be plated with gold, silver, nickel, palladium, copper or other metals. Leadframe 20 of FIG. 2 is grounded during this wiring step to prevent damage to the integrated circuit devices due to electrostatic discharge.

Figure 4:
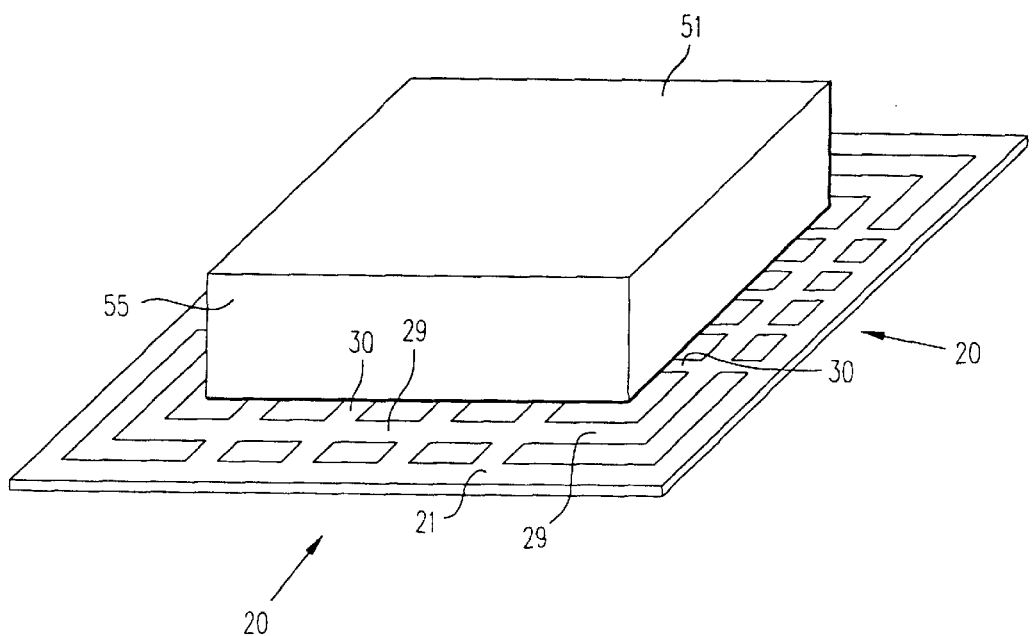
FIG. 4 is pective view of the leadframe of FIG. 2 after die attach and encapsulation with a molded encapsulant.

In Step 4 of FIG. 1, a viscous adhesive encapsulating material is applied-onto leadframe 20 of FIG. 2. The encapsulant material covers, among other things, integrated circuit die 52, bond wires 54, side surfaces 26 and 27 of die pad 22, first surface 23 and third surface 25 of die pad 22, and first surface 31, third surface 33 and the side surfaces of leads 30 (FIGS. 4 and 5). Second surface 24 of die pad 22 and second surface 32 of leads 30 are not covered with encapsulant material, i.e., remain exposed. In an alternative embodiment, die pad 22 may be up set during the encapsulation step so that a thin layer of encapsulant material forms under second surface 24 of die pad 22. In such an embodiment, die pad 22 is entirely internal to the package body. Finally, the encapsulant material is hardened.

There are several methods by which Step 4 of FIG. 1 may be accomplished, depending on the application. For example, Step 4 of FIG. 1 may be accomplished using conventional plastic molding techniques. In such a method, leadframe 20 of FIG. 2 is placed in a mold, and a block of solid molded encapsulant material is formed above and on leadframe 20, as shown in FIG. 4. The encapsulant material may be a conventional plastic molding compound applied using conventional techniques. Example molding compounds include NITTO MP-8000AN molding compound from the Nitto Company of Japan, and EME 7351 UT molding compound from the Sumitomo Company of Japan. Conventional gates may be formed in leadframe 20 to assist in the molding process. The side surfaces of the mold may be tapered to facilitate release from the mold.

Alternatively, instead of using a molding process for Step 4, Step 4 may be accomplished using a liquid encapsulant. For example, as a first step, leadframe 20 of FIG. 2 is placed on a horizontal surface. As a-second step, a contiguous bead of a conventional hardenable viscous adhesive material, such as HYSOL 4451 epoxy from the Dexter-Hysol Company of City of Industry, California, is applied onto leadframe 20, forming a closed rectangular dam around die 52 and at least the portion of leads 30 inside of dam bar 29. As a third step, the bead is solidified, such as by heating at 140° C. for one hour. As a fourth step, a conventional hardenable viscous adhesive material suitable for encapsulating packages, such as HYSOL 4450 liquid encapsulant, is applied within the bead so that the incomplete package within the dam is covered with encapsulant material. As a final step, the encapsulant material is hardened, such as by heating at 140° C. for one hour, forming a single solid block of encapsulant material above and on leadframe 20. Where this method is used for Step 4, Step 6 uses a saw to cut through the encapsulant material to form orthogonal package sides and to cut a completed package from the leadframe. A similar molding process and a subsequent sawing step for cutting a leadframe from such a package is described U.S. patent application Ser. No. 09/103,760, which was filed on Jun. 24, 1998 and is incorporated in full herein by reference.

In Step 5 of FIG. 1, the portions of leadframe 20 of FIG. 2 which are not covered with the encapsulant material, including second surface 24 of die pad 22 and second surfaces 32 of leads 30, are plated using a conventional plating metal compatible with printed circuit boards. Example plating metals include gold, nickel palladium, inconel, lead tin solder, or tantalum, depending on the application. Step 5 may be omitted where the metal used for forming leadframe 20 does not require plating, or is pre-plated. For example, Step 5 is omitted where the metal strip used for making leadframe 20 is copper with nickel palladium plating.

FIG. 4 is a perspective view of leadframe 20 of FIG. 2 after the completion of Steps 1–5 of FIG. 1. In this example, a molding process was used for Step 4. A block of hardened encapsulant material forms package body 51. The tapered sides 55 of package body 51 are within dam bar 29. Accordingly, exposed portions of leads 30 extend between sides 55 of package body 51 and dam bar 29.

Step 6 of FIG. 1 cuts encapsulated leadframe 20 (FIG. 4) along lines A—A, B—B, C—C, and D—D of FIG. 2. Referring to FIG. 2, Step 6 severs leads 30 inside of dam bar 29. The cut is made through second surface 32 of leads 30 (FIG. 3). Step 6 also severs connectors 28 inside of dam bar 29. Finally, Step 6 completes the formation of the package by cutting a completed package away from the disposable portions of leadframe 20.

Step 6 may be performed using a punch, a saw, or equivalent shearing apparatus. For example, a punch or a saw may be used where package body 35 is molded, as shown in FIG. 5. Where a punch is used, a completed package is cut from leadframe 20 in a single punch operation. The package is inverted, and the punch cuts leads 30 inside of dam bar 29. The location of the cut can vary so that the portion of severed leads 30 extending from package sides 55 can range from zero to, for example, 0.50 mm in length.

FIG. 5 is a cross-sectional side view of a completed package 50 in accordance with the present invention. Package 50 was made from leadframe 20 of FIG. 2 and punched from FIG. 4. Package body 51 of package 50 was molded. Package 50 has a planar or substantially planar external lower second surface 52, and tapered side surfaces 55.

Consistent with the construction of package 50 from leadframe 20 of FIG. 2, die pad 22 of package 50 of FIG. 5 includes a planar or substantially planar upper first surface 23. Opposite first surface 23 of die pad 22 is both a planar or substantially planar second surface 24 and a planar or substantially planar peripheral third surface 25. Third surface 25 surrounds second surface 22 and is vertically recessed a distance "H1" from second surface 22. Third surface 25 is vertically between first surface 23 and second surface 24 and is covered with the encapsulant material that forms package body 51. The encapsulant material beneath third surface 23 prevents die pad 22 from being pulled vertically from the package. Second surface 22 is exposed at lower surface 56 of package 50, and accordingly forms part of lower second surface 56 of package 50. In alternative embodiments, die pad 22 is entirely internal to package body 51.

In FIG. 5, integrated circuit die 52 is on and attached to first surface 23 of die pad 22. A bond wire 54 is connected between each bonding pad 53 of die 52 and a first surface 31 of a lead 30.

Package 50 of FIG. 5 includes a plurality of leads 30, each of which were severed from leadframe 20 of FIG. 2 through a second surface 32 at a point inside of dam bar 29. The arrangement and numbers of severed leads 30 varies, depending on the design of the leadframe used to make the package and the application. For example, as in FIG. 2, leads 30 have both straight and bending lateral paths.

As in FIG. 2, each severed lead 30 includes a planar or substantially planar first surface 31, an opposite planar or substantially planar second surface 32, and opposite planar or substantially planar third surface 33. Third surface 33 is vertically recessed a distance "H1" from second surface 32 so that encapsulant material covers third surface 33. In other words, third surface 33 is vertically between first surface 31 and second surface 32. Second surfaces 32 of leads 30 are not covered by encapsulant material, but instead are exposed at lower surface 56 of package 50.

In FIG. 5, the portion of first surface 31 of lead 30 that is internal to package body 51 is in the same horizontal plane as first surface 23 of die pad 22, and third surface 33 of lead 30 is in the same horizontal plane as third surface 25 of die pad 22. In an alternative embodiment (not shown), where die pad 22 is up set in the mold, the portion of first surface 31 of lead 30 that is inside package body 51 would be in a lower horizontal plane than first surface 23 of up set die pad 22.

Each severed lead 30 of FIG. 5 includes a severed end portion 35 that extends laterally beyond package side 55 and is bent upwards at an oblique angle θ to the horizontal remainder of second surface 32 of lead 30 and lower package surface 56. Angle θ may be about 15 to 70 degrees, although the angle may vary. As shown, the upwardly bent terminal portion of second surface 32 of lead 30 is exposed. An example length of bent end portion 35 of lead 30 is about 0.15 mm beyond package side 55, but this length may vary with the application. A range of values for the length of end portion 35 of severed lead 30 is zero to 0.50 mm.

Severed end portion 35 of lead 30 of FIG. 5 may be bent upwards during Step 6 by a stamping machine used to punch package 50 from leadframe 20. In an alternative embodiment (not shown), terminal portion 35 of lead 30 may be bent upwards so that it is in contact with package side 55, i.e., angle θ equals the angle from horizontal of tapered package side 55. In a further alternative embodiment (not shown), Step 6 of FIG. 1 may cut lead 30 at package side 55 so that the severed end of lead 30 does not extend laterally beyond package side 55.

In an alternative embodiment (not shown), severed end portion 35 of lead 30 extends laterally in a horizontal plane beyond package side 55. In other words, severed end portion 35 is not bent as in FIG. 5, but rather extends laterally in the same horizontal plane as the remainder of lead 30 so that angle θ equals zero degrees. Such a package would result where a saw is used for Step 6. If desired, where a saw is used for Step 6, end portion 35 may be bent upwards to achieve the configuration of FIG. 5 with the addition of a separate bending step.

Figure 6:
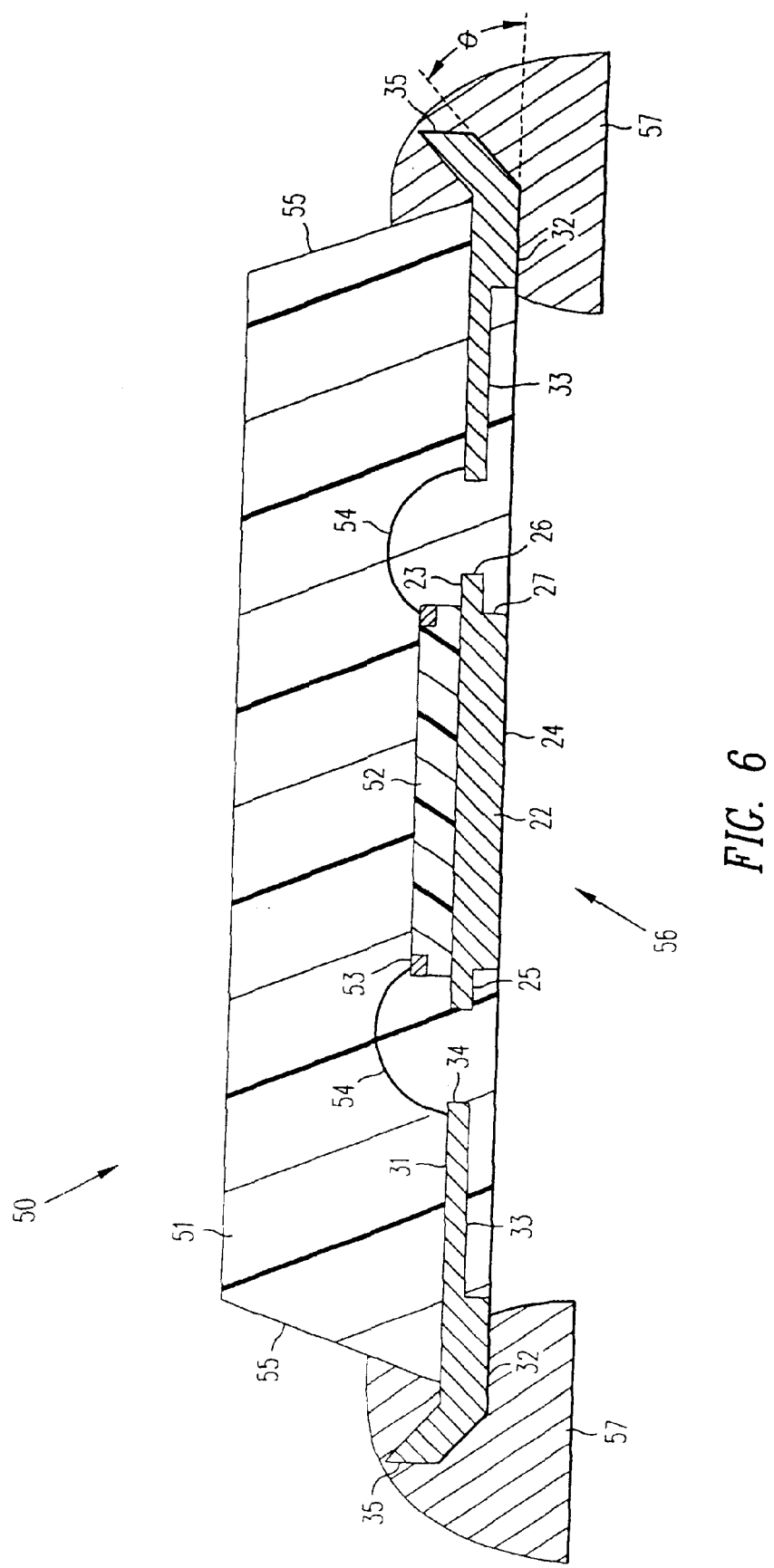
FIG. 6 is a cross-sectional view of the package of FIG. 5 after attachment of a solder bump to the exposed portions of the lead.

In FIG. 6, a solder bump 57 is attached between package 50 and a printed circuit board (not shown). Solder bump 57 contacts second surface 32 of lead 30 and also covers bent end portion 35 of lead 30.

In an alternative embodiment (not shown), the exposed second surface 24 of die pad 22 also may be conductively connected, such as by solder paste, to the printed circuit board to facilitate package cooling. The cooling occurs by thermal conduction.

Figure 7:
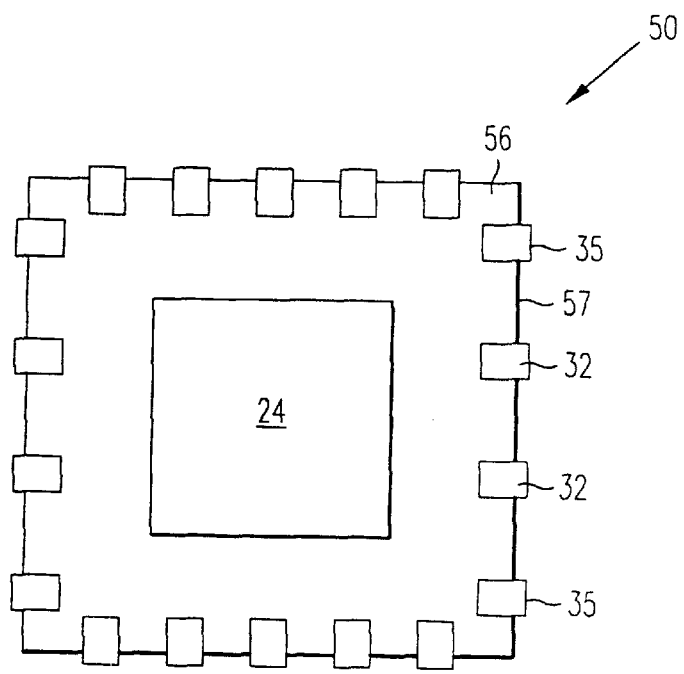
FIG. 7 is a view of the lower external surface of the package of FIG. 5.

FIG. 7 shows the lower external surface 56 of package 50 of FIG. 5. Second surface 56 of package 50 consists of second surface 24 of die pad 22, second surfaces 32 of severed leads 30, and hardened encapsulant material. Second surfaces 36 of leads 30 have rectangular perimeters. Severed end portions 35 of leads 30 extend slightly beyond the edge of lower surface 56. Different sizes and shapes for second surfaces 32, such as circular, are possible depending on the application. Second surface 24 of die pad 22 also has a rectangular perimeter, but other shapes are possible.

Figure 8:
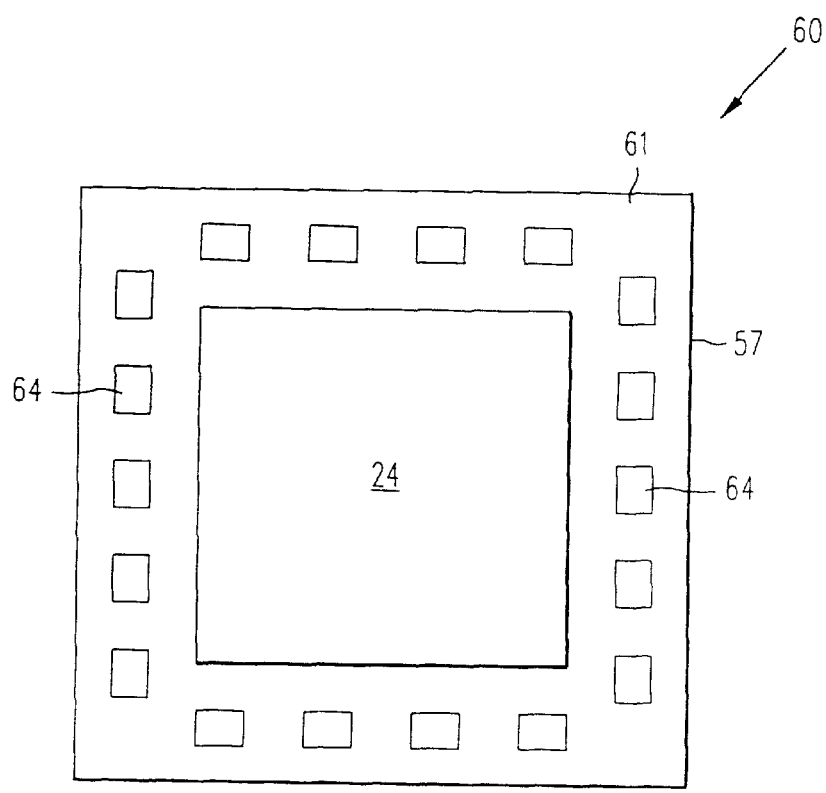
FIG. 8 is a plan view of the lower external surface of an alternative package.

In FIG. 7, second surfaces 32 of leads 30 are aligned in a row along the edges of lower surface 56 of package 50. Severed end portions 35 of leads 30 extend slightly beyond the perimeter of lower surface 56. FIG. 8 shows the lower external surface 61 of an alternative package 60, which is also within the present invention. In FIG. 8, the exposed, rectangular second surfaces 64 of severed leads 63 of FIG. 9) are aligned in single rows that are located a short distance inward from the edge of lower surface 61 of package 60. As an example, second surfaces 64 are located about 0.05 to 0.50 mm from the perimeter of lower surface 61 of package 60, but the distance varies with the application. In an alternative embodiment (not shown), second surfaces 64 have a circular, rather than rectangular, perimeter, and form a solder interconnection ball land.

Figure 9:
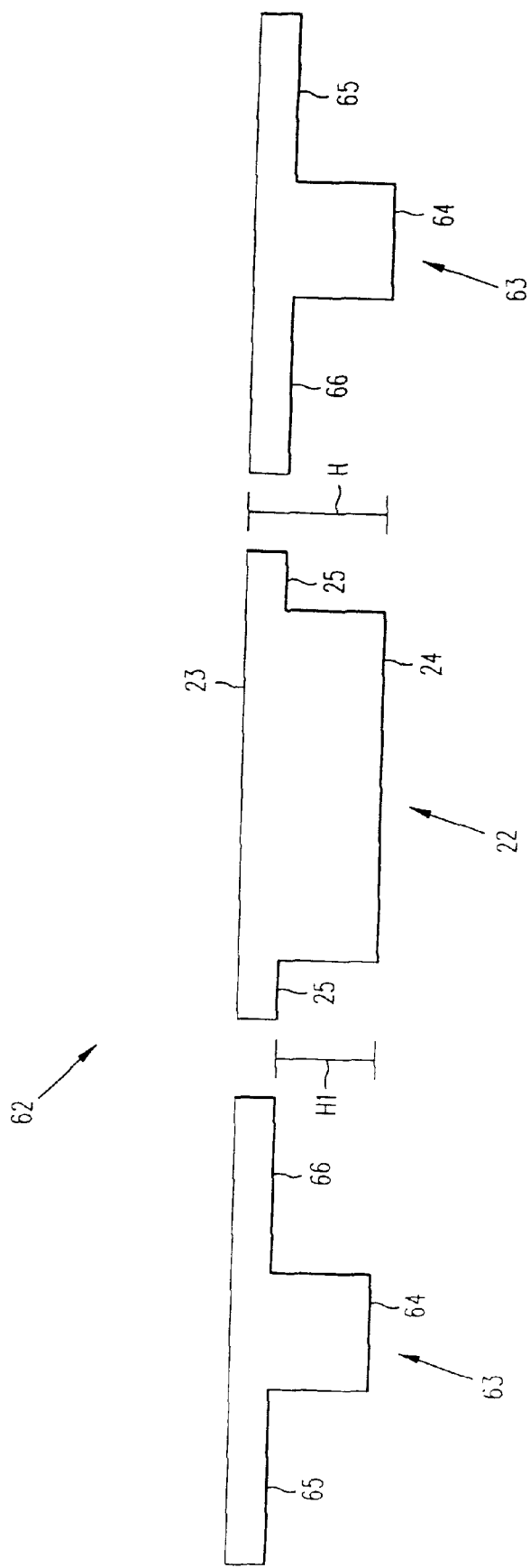
FIG. 9 is a cross-sectional view, taken inside a dam bar, of a die pad and leads of a leadframe for making the package of FIG. 8.

FIG. 9 is a cross-sectional view, taken inside of dam bar 29, of a die pad 22 and leads 63 of a leadframe 62 for making package 60 of FIG. 8. Leadframe 62 of FIG. 9 is largely identical to leadframe 20 of FIGS. 2 and 3 and is made the same way, except as to the arrangement, number, and location of the vertically recessed lower surfaces of lead 63. Accordingly, redundant discussion is omitted.

Like lead 30 of FIG. 2, lead 63 of FIG. 9 includes a planar or substantially planar first surface 31 and an opposite planar or substantially second surface 64. Second surface 64 serves as an external contact for the package. Unlike second surface 32 of leadframe 20 of FIGS. 2 and 3, however, second surface 64 of lead 63 of FIG. 9 is not located immediately inside and adjacent to dam bar 29 (FIG. 2), but rather is located nearer to die pad 24 between third surface 66 and fourth surface 65 of lead 63. Third surface 66 and fourth surface 65 are opposite first surface 31, are planar or substantially planar, are in the same horizontal plane, and are vertically recessed a distance "H1" from second surface 64 of lead 63 (.e., are vertically between second surface 31 and second surface 64). Fourth surface 65 is laterally between dam bar 29 (not shown but similar to FIG. 2) and second surface 64, and third surface 66 in between second surface 64 and die pad 22.

The perimeter of second surface 64 of lead 63 of FIGS. 8 and 9 may be a variety of shapes to facilitate different external connections of the package. For example, second surface 64 may have a rectangular perimeter, as in FIG. 8. Alternatively, second surface 64 may have a circular perimeter.

Figure 10:
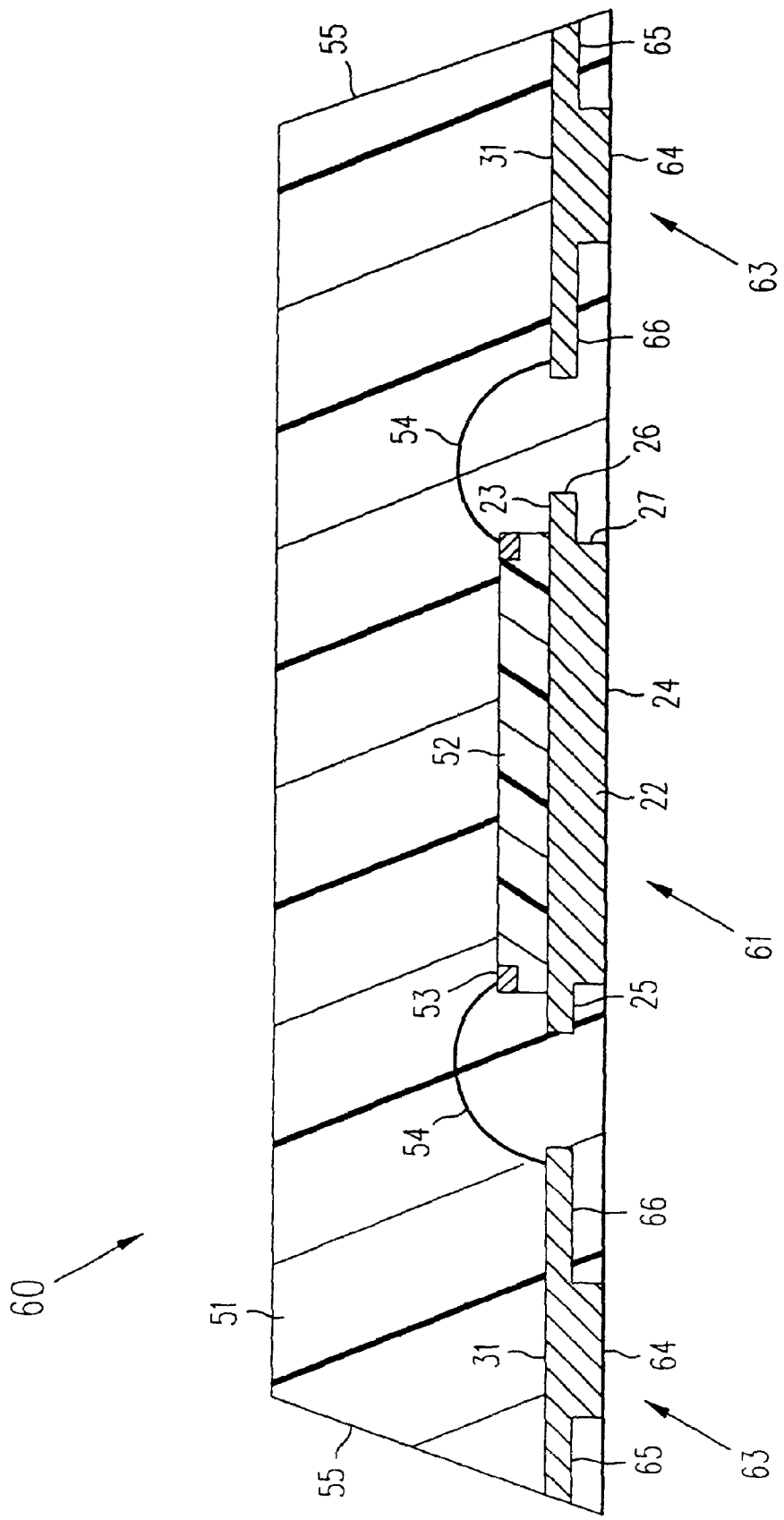
FIG. 10 is a cross-sectional side view of the package of FIG. 8

FIG. 10 is a cross-sectional side view of package 60 of FIG. 8. The package of FIG. 10 is made according to the process of FIG. 1 using the leadframe of FIG. 9. As shown, fourth surface 65 is adjacent to package side 57, and second surfaces 64 are located a selected distance inside the perimeter of lower surface 61 of package 60.

In FIGS. 8 and 10, the encapsulant material forming the package body covers all of lead 63 except second surface 64. In other words, third surface 66 and fourth surface 65 of leads 63 are covered with encapsulant material, and thus are internal to the package. In alternative embodiments, where the severed ends of the leads extend beyond the package sides (e.g., FIG. 5), encapsulant material also does not cover the portions of the severed leads that extend beyond the package sides.

Figure 11:
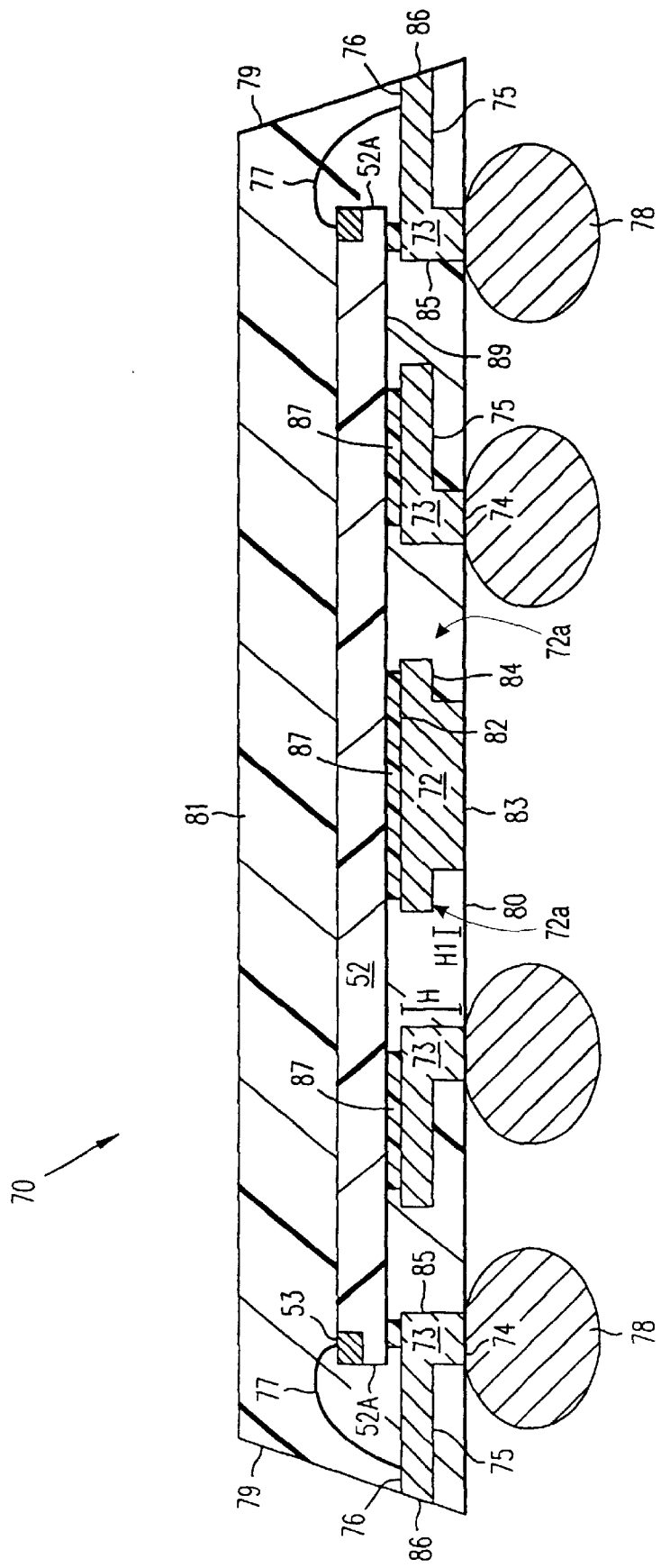
FIG. 11 is a cross-sectional view of an alternative package where the die extends laterally over the perimeter of the die pad and over part of the length of the leads.

FIG. 11 is a cross sectional side view of an alternative package 70, in accordance with the present invention, which may be made by the method of FIG. 1. FIG. 11 is taken along line 11—11 of FIG. 12. Die 52 is attached to upper first surface 82 of die pad 72 with conventional epoxy die attach material 87. Die 52 extends over the perimeter 72a of die pad 72 and over upper first surfaces 76 of leads 73 of package 70. Accordingly, package 70 is near chip size. The distance between side 52A of die pad 52 and package side 77 may be as little as about 0.6 mm or less on sides where bond wires are present. In an alternative embodiment (not shown), die 53 extends over the perimeter of die pad 72, but does not extend over leads 73. In another alternative embodiment (not shown), where bond wires are located only on two, rather than all four, sides of the die, the distance between a die side 52A where bond wires are not connected and the package side may be as little as about 0.1 mm.

In FIG. 11, four leads 73 are shown. Only part of the length of the two inner leads 73 are shown in this cross section because those inner leads include lateral bends, as shown by leadframe 71 of FIG. 13, and these are behind the two outside leads 73.

In FIG. 11, a short bond wire 77 is connected between each bonding pad 53 on die 55 and an upper first surface 76 of a lead 73. The connection of bond wire 77 to first surface 76 is made at a first end 86 of lead 73 adjacent to package sides 79.

Figure 12:
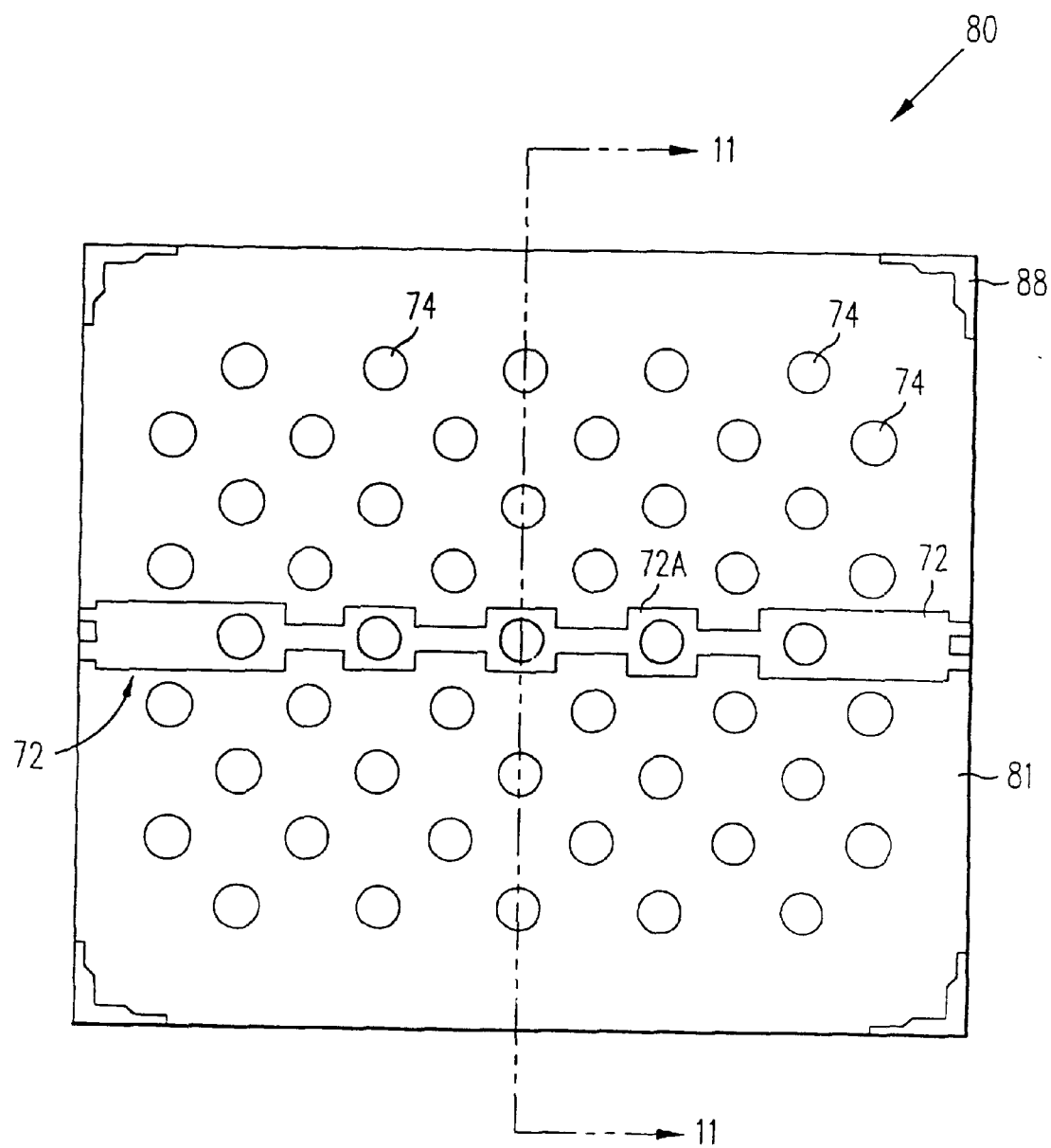
FIG. 12 is a plan view of the lower external surface of the package of FIG. 12 without solder interconnection balls.

Package 70 of FIG. 11 is a ball grid array package, although a land grid array ("LGA") package also is possible. As shown in FIG. 12, an array of solder interconnection balls 78 is formed on lower external surface 80 of package 70. Accordingly, the distances between second surfaces 74 of different leads 73 and package sides 79 vary (see FIG. 12).

Package body 81 of FIG. 11 is formed of molded encapsulant material, although other encapsulation methods may be used. During Step 4 of FIG. 1, the encapsulant material fills in between lower surface 89 of die 52 and first surfaces 76 of leads 73. A nonconductive (i.e., insulative) adhesive epoxy 87, which is located between lower surface-89 of die 52 and first surface 82 of die pad 72, attaches die 52 to die pad 72 and spaces die 52 above first surfaces 76 of leads 73. In addition, where die 52 extends over leads 73, additional insulative epoxy 87 is applied between lower surface 89 of die 55 and first surfaces 76 of leads 73 to space apart die 55 and leads 73.

Each lead 73 of FIG. 11 has a planar or substantially planar first surface 76. Opposite first surface 76 is both a planar or substantially planar second surface 74 and a third surface 75. Second surface 74 is located at a second end 85 of each lead 73 that is opposite first end 86. By contrast, the locations of second surface 32 of lead 30 of package 50 of FIG. 6 and second surface 64 of lead 63 of package 60 of FIG. 8 were at or close to, respectively, the perimeter of the lower external surface of their respective packages.

In FIG. 11, third surface 75 of each lead 73 is adjacent to and vertically recessed a distance "H1" from second surface 74 of lead 73. Third surface 75 is vertically between first surface 76 and second surface 74, and is formed by the same partial etching process as third surface 33 of lead 30 of FIGS. 3 and 5, as described above. As shown, encapsulant material covers third surface 75, and thereby prevents lead 73 from being pulled vertically from package body 81. Encapsulant material does not cover second surface 74 of leads 73.

Die pad 72 of package 70 of FIG. 11 has a planar or substantially planar first surface 82. Opposite first surface 82 is both a planar or substantially planar second surface 83 and a peripheral planar or substantially planar third surface 84. Third surface 84 surrounds second surface 83 and is vertically recessed a distance "H1" from second surface 83. First surface 82 of die pad 72 is in the same horizontal plane as first surface 76 of leads 73.

Third surface 84 of die pad 72 of FIG. 11 is vertically between first surface 82 and second surface 83 and is formed by the same partial etching process as third surface 23 of die pad 22 of FIGS. 3 and 5. As shown in FIG. 1, encapsulant material covers third surface 84 of die pad 72, and thereby prevents die pad 72 from being pulled vertically from package body 81. Encapsulant material does not cover second surface 83 of die pad 72. To aid in package cooling, second surface 83 of die pad 72 may connected by solder interconnection balls or an equivalent conductor to an external printed circuit board. Alternatively, die pad 72 may be up set during Step 4 of FIG. 1 so that die pad 72 is covered by encapsulant material and therefore entirely internal to package body 81. In such a case, first surface 76 of leads 73 would be below first surface 82 of die pad 72.

FIG. 12 is a bottom plan view of lower external surface 80 of package 70 of FIG. 11 prior to the placement of solder interconnection balls on second surfaces 74 of leads 73. As shown, second surfaces 74 are circular and arranged in an array. Third surfaces 75 of leads 73 are not visible in this view because third surfaces 75 are covered with encapsulant material, and thus are internal to package body 81. A metal corner plate 88 is at each of the four corners of lower surface 80.

Figure 13:
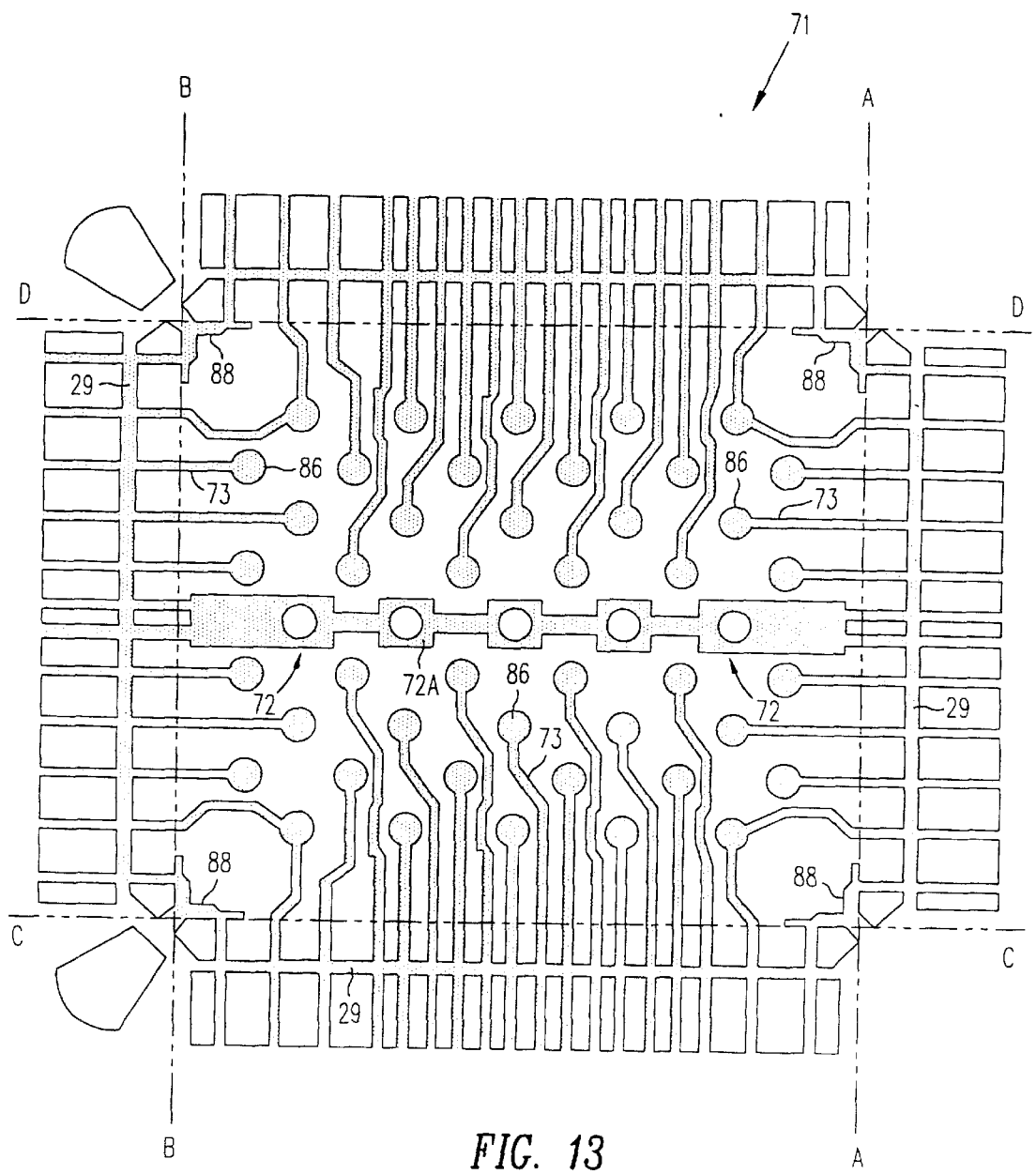
FIG. 13 is a plan view of a leadframe for making the package of FIGS. 11 and 12.

FIG. 13 is a plan view of a leadframe 71 suitable for making package 70 of FIGS. 11 and 12. Unlike rectangular die pad 22 of FIG. 2, die pad 72 of FIG. 13 is a segmented strip connected to two parallel sides of dam bar 29. Die pad 72 includes four rectangular portions 72A, which may be connected by solder balls to a printed circuit board to facilitate package cooling.

Leads 73 of FIG. 13 are a variety of shapes and lengths, which vary according to the application. In particular, some leads 73 are laterally straight in their extension from dam bar 29 to their respective circular second surfaces 74 at second lead ends 85 (FIG. 11). Other leads 73 have one or more lateral bends between dam bar 29 and their respective second surfaces 74 at second lead ends 85 (FIG. 1 1). Two leads 73 at each corner of leadframe 71 are connected to the same lead end 86, but this is not necessary. In an alternative embodiment (not shown), leads 73 may have anchor ears or throughholes to engage the encapsulant material. During Step 6 of FIG. 1, each lead 73 is severed from leadframe 71 inside of dam bar 29 of FIG. 13. The cut is made inside dam bar 29 at the outside edges of metal corners 88 of leadframe 71 along lines A—A, B—B, C—C, and D—D of FIG. 13.

Artisans will appreciate that numerous variations of the packages, leadframes, and assembly methods described above are possible in view of the present disclosure. For example, FIG. 14 is a flow chart of an alternative assembly method where a plurality of packages along the lines of FIG. 5, 10 or 11 are formed simultaneously. The basic steps of the FIG. 14 process are the same as the FIG. 1 process, and thus it is not necessary for the steps to be described in detail. The difference between the FIG. 1 process and the FIG. 14 process is that the steps are modified to accommodate the making of a plurality of packages. simultaneously. The process of FIG. 14 is enabled by the provision in Step 1 of a plurality of leadframes, such as leadframes 20, 62, or 71, etched adjacent to one and other in the form of a matrix in a single sheet of metal strip.

Figure 15:
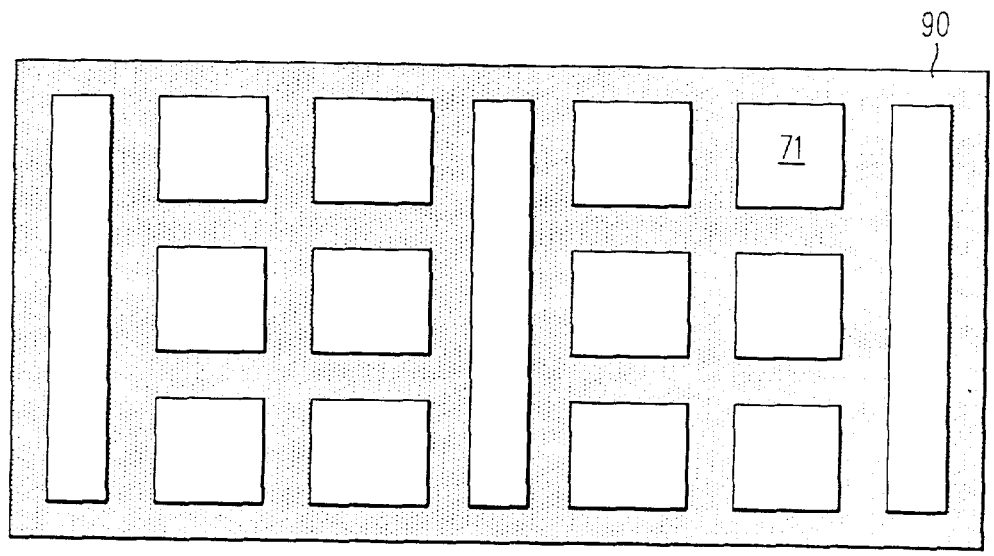
FIG. 15 is a plan view of two matrixes of six leadframes etched into a metal strip.

FIG. 15 shows a matrix of twelve leadframes 71 (FIG. 11) on a metal strip 90. The number of leadframes 71 etched into strip 90 are variable. For example, thirty six or sixty four leadframes 91 may be etched into strip 90. Leadframes 91 were simultaneously etched into strip 90 using the above-described two-step chemical etching method, or the two step progressive stamping then chemical etching method. For the configuration of FIG. 15, Step 4 of FIG. 14 may be performed using conventional molding techniques, as described above, to form individual package bodies 81 on each leadframe 71 of strip 90. In other words, the mold has individual mold cavities for each die, and forms an array of individual incomplete packages like FIG. 4. Step 6 cuts individual packages 70 from strip 90 using a punch or saw.

Figure 16:
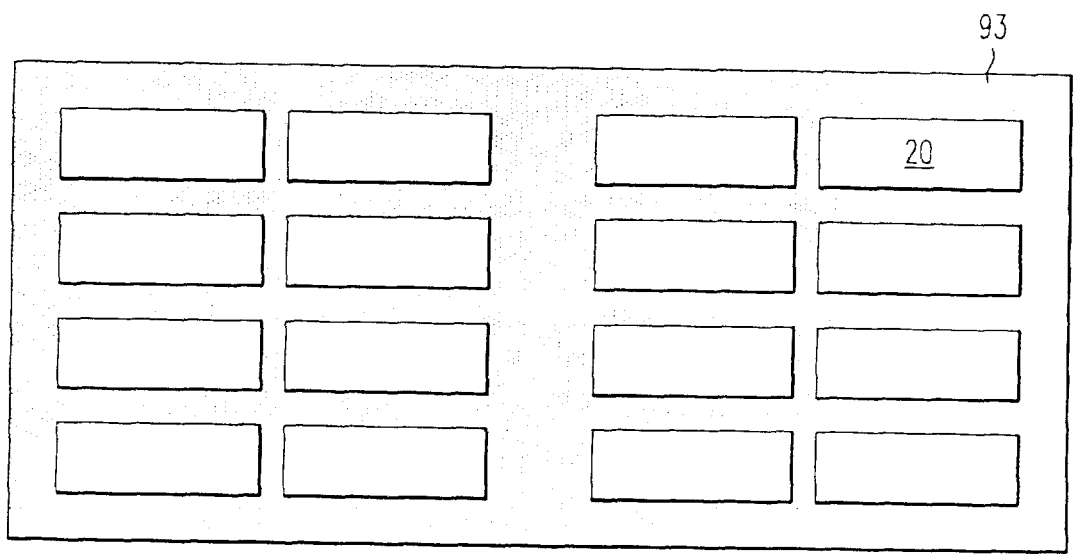
FIG. 16 is a plan view of two matrixes of eight leadframes etched into a metal strip.

FIG. 16 shows an alternative strip 93 into which two matrixes of eight leadframes 20 (FIG. 2) have been etched. Instead of molding individualized packages during Step 4 of FIG. 14, a single block of encapsulant material is applied over all of the leadframes 20 of each of the two matrixes. These blocks of encapsulant may be formed by, first, writing a bead of HYSOL 4451 adhesive around each matrix of leadframes 20 of FIG. 16. After the bead is solidified, HYSOL 4450 liquid encapsulant or equivalent is applied within the bead so that each die 52 and incomplete package 50 within the dam is covered with encapsulant material. Next, the encapsulant material is hardened, such as by heating, forming a contiguous block of encapsulant material above and on each of the two matrixes of leadframes 20. In Step 6 of FIG. 14, a saw is used to cut eight individual packages 50 from each of the two matrixes of strip 93. Step 6 severs the connections between the leadframe 20 and die pad 22 and leads 30. Step 6 also cuts through the block of encapsulant material to form orthogonal package sides.

The above description of embodiments of this invention is intended to be illustrative and not limiting. Other embodiments of this invention will be obvious to those skilled in the art in view of the above disclosure.

What is claimed is:

1. A package for an integrated circuit device comprising:
   a metal die pad having a substantially planar first surface, a substantially planar second surface, and a substantially planar third surface, wherein the second surface and the third surface are opposite the first surface, and the third surface is at the periphery of the second surface vertically between the first surface and the second surface; an integrated circuit device on the first surface of the die pad;
   an integrated circuit device on the first surface of the die pad;
   a plurality of metal leads each having a substantially planar first surface, a substantially planar second surface, a substantially planar third surface, and a pair of anchor ears projecting from two lateral sides thereof for preventing the leads from being pulled horizontally from the integrated circuit package, wherein the second surface and the third surface are opposite the first surface, and the third surface is vertically between the first surface and the second surface;
   a plurality of conductors, each conductor connected between a conductive pad on the integrated circuit device and the first surface of one of the leads; and
   an encapsulant material which forms a package body, wherein the encapsulant material covers the third surface of the die pad and the third surfaces of the leads; and wherein the second surfaces of the leads are exposed at a first external surface of the package, and the first surface of the leads are in the same horizontal plane as the first surface of the die pad or below the first surface of the die pad.

2. The package of claim 1, wherein the first surface of the die pad is in the same horizontal plane as the first surfaces of the leads, and the second surface of the die pad is exposed at the first external surface of the package.

3. The package of claim 2, wherein the second surface of the lead has a circular perimeter.

4. The package of claim 2, wherein the second surface of the lead has a rectangular perimeter.

5. The package of claim 2, wherein the first external surface of the package has a perimeter, and the second surfaces of all or a plurality of the leads are at said perimeter.

6. The package of claim 2, wherein the first external surface of the package has a perimeter, and the second surfaces of all or a plurality of the leads are inside of said perimeter such that encapsulant material is between said perimeter and the second surface of each such lead.

7. The package of claim 6, wherein each lead having a second surface inside said perimeter includes a substantially planar fourth surface opposite the first surface of the lead, wherein the fourth surface is vertically between said first surface and said second surface of the lead, and the fourth surface is laterally between the second surface of the lead and the perimeter of the first external surface of the package.

8. The package of claim 2, wherein the package has peripheral sides, and a plurality of said leads include a first portion that extends beyond the sides of the package.

9. The package of claim 8, wherein the first portion of the leads is bent upwards.

10. The package of claim 1, wherein the first surface of the die pad has a perimeter, and the integrated circuit device extends over the perimeter of the die pad.

11. The package of claim 10, wherein the integrated circuit device extends over a portion of the leads.

12. The package of claim 1, further comprising a plurality of bent metal leads laterally extending over the metal leads toward the die pad without contacting the die pad.

13. The package of claim 1, wherein the die pad has a rectangular periphery, and the package further comprises four bent metal leads around four corners of the die pad without contacting thereto.

14. The package of claim 1, wherein the anchor ears are approximately rectangular.

15. The package of claim 1, wherein the anchor ears are staggered on adjacent metal leads.

16. An integrated circuit package comprising:
   a die pad defining:
      a generally planar first die pad surface;
      a generally planar second die pad surface disposed in opposed relation to the first die pad surface and including a peripheral edge; and
      a third die pad surface disposed in opposed relation to the first die pad surface, the third die pad surface being recessed relative to and extending about the peripheral edge of the second die pad surface;
   an integrated circuit device disposed on the first die pad surface;
   a plurality of leads defining:
      a generally planar first lead surface;
      a generally planar second lead surface disposed in opposed relation to the first lead surface;
      a third lead surface disposed in opposed relation to the first lead surface and recessed relative to the second lead surface; and at least one anchor ear projecting from each of the leads for preventing the leads from being pulled horizontally from the integrated circuit package;

a plurality of conductors, each of the conductors being electrically connected to and extending between the integrated circuit device and respective ones of the first surfaces of the leads; and a package body at least partially encapsulating the die pad, the integrated circuit device, the leads and the conductors such that the second lead surfaces of the leads are exposed within the package body and the third die pad surface of the die pad and the third lead surfaces are covered thereby.

17. The package of claim 16 wherein the first die pad surface of the die pad and the first lead surfaces of the leads extend in generally co-planar relation to each other.

18. The package of claim 16 wherein the second die pad surface of the die pad is exposed within the package body.

\* \* \* \* \*